United States Patent
Bai et al.

[11] Patent Number: 6,166,417
[45] Date of Patent: Dec. 26, 2000

[54] COMPLEMENTARY METAL GATES AND A PROCESS FOR IMPLEMENTATION

[75] Inventors: Gang Bai; Chunlin Liang, both of San Jose, Calif.

[73] Assignee: Intel Corporation, Santa Clara, Calif.

[21] Appl. No.: 09/109,993

[22] Filed: Jun. 30, 1998

[51] Int. Cl.[7] .................................................. H01L 29/78
[52] U.S. Cl. ........................ 257/407; 257/392; 257/388
[58] Field of Search .................................. 257/388, 407, 257/357, 369, 751, 371, 412, 413, 691, 351, 270, 250, 331, 392

[56] References Cited

U.S. PATENT DOCUMENTS

| | | | |
|---|---|---|---|
| 3,936,860 | 2/1976 | Hill | 357/23 |
| 4,555,842 | 12/1985 | Levinstein et al. | 29/571 |
| 5,559,351 | 9/1996 | Takiyama et al. | 257/324 |
| 5,796,166 | 8/1998 | Agnello et al. | 257/751 |
| 5,834,353 | 11/1998 | Wu | 257/411 |
| 5,912,509 | 6/1999 | Kasai et al. | 257/775 |
| 5,945,821 | 8/1999 | Sakurai et al. | 323/313 |
| 5,973,363 | 10/1999 | Staab et al. | 257/347 |

FOREIGN PATENT DOCUMENTS

| | | | |
|---|---|---|---|
| 52-014383 | 2/1977 | Japan . | |
| 57-114281 | 7/1982 | Japan . | |
| 60-045053 | 3/1985 | Japan . | |
| 62-126671 | 6/1987 | Japan . | |
| 62-245658 | 10/1987 | Japan | 257/407 |
| 3-227562 | 10/1991 | Japan | 257/407 |

*Primary Examiner*—David Hardy
*Attorney, Agent, or Firm*—Blakely, Sokoloff, Taylor & Zafman LLP

[57] ABSTRACT

A transistor device includes a gate dielectric overlying a substrate, a barrier layer overlying the gate dielectric, and a gate electrode overlying the barrier layer. The barrier layer of the device has a physical property that inhibits interaction between the gate dielectric and the gate electrode.

6 Claims, 3 Drawing Sheets

COMPLEMENTARY METAL GATES AND A PROCESS FOR IMPLEMENTATION

BACKGROUND OF THE INVENTION

1. Field of the Invention

In the context of insulated gate field effect transistors, the invention relates to integrated circuit devices and more particularly to complementary metal gate devices.

2. Background Information

A metal gate electrode has distinct advantages over a polysilicon gate for current and future technologies of high performance integrated circuit devices. At inversion, a gate electrode of polysilicon, for example, will generally experience a depletion of carriers in the area of the polysilicon near the gate dielectric resulting in a reduced electric field at the surface of the semiconductor. The polysilicon depletion effect is not as significant with gate dielectrics having thicknesses of 50 Å or more. However, as gate dielectric thicknesses decrease, the contribution of the voltage drop at inversion due to the role of the polysilicon depletion effect on device performance will be important. Thus, the polysilicon depletion effect must be accounted for in device scaling. A metal gate electrode does not suffer from the depletion effect associated with a polysilicon gate electrode. A metal gate electrode also reduces the parasitic resistance of a gate electrode line to accommodate the use of longer gate electrodes in integrated circuit design for applications such as stacked gates, word lines, buffer drivers, etc. Longer gate electrodes generally correspond to field effect transistors of greater width.

A semiconductor such as silicon has a certain energy level measured conventionally by its Fermi level. The Fermi level of a material determines its work function. The intrinsic Fermi level of an undoped semiconductor is at the middle of the bandgap between the conduction and valence band edges. In an N-type doped silicon, the Fermi level is closer to the conduction band than to the valence band (e.g., about 4.15 electron-volts). In a P-type doped silicon, the Fermi level is closer to the valence band than the conduction band (e.g., about 5.2 electron-volts).

Metals, metal alloys, metal silicides, metal nitrides, and metal oxides (collectively herein "metals") have been identified that have work functions similar to the work function of a conventional P-type doped semiconductor substrate and of a conventional N-type doped semiconductor substrate. Examples of metals that have a work function similar to a P-type doped semiconductor material, include but are not limited to, nickel (Ni), Ruthenium oxide (RuO), and molybdenum nitride (MoN). Examples of metals that have a work function similar to an N-type doped semiconductor material, include but are not limited to, ruthenium (Ru), zirconium (Zr), niobium (Nb), tantalum (Ta), and titanium silicide ($TiSi_2$).

Prior art metal gate electrodes are used in complementary metal oxide semiconductor (CMOS) technology in the form of mid-bandgap (e.g., Fermi level located in the middle of the conduction and valence band of a silicon substrate) metal gate electrodes to maintain the symmetry between NMOS and PMOS devices. The shortcoming of the mid-bandgap metal technique is that a mid-bandgap metal cannot deliver the small threshold voltage ($V_T$) necessary for future technologies without degrading short channel effects. To date, however, a complementary metal gate approach with individual work functions optimized for both NMOS and PMOS devices has not been integrated into a workable process. The simple method to deposit complementary metals damages the underlying thin gate dielectrics during patterning, making the transistor with the damaged gate dielectric unusable.

What is needed is a method of utilizing complementary metal gate electrode technology in CMOS circuits.

SUMMARY OF THE INVENTION

A transistor device is disclosed. The transistor device includes a gate dielectric overlying a substrate, a barrier layer overlying the gate dielectric, and a gate electrode overlying the barrier layer. The barrier layer of the device has a physical property that inhibits interaction between the gate dielectric and the gate electrode.

DETAILED DESCRIPTION OF THE INVENTION

An apparatus employing metal gate electrodes tuned for or having a work function similar to the desired device type is disclosed. The invention is particularly useful for, but not limited to, the utilization of metal gate electrodes in CMOS technology tuned for optimum NMOS and PMOS device performance. The invention offers a workable process for providing integrated complementary metal gate electrode technology that does not damage the gate dielectric during patterning.

Figure 1:
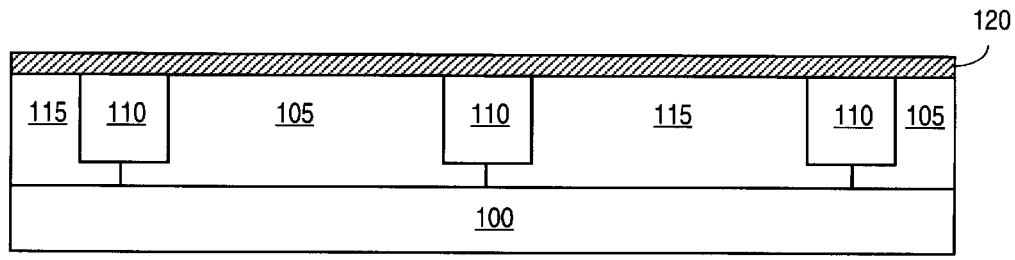
FIG. 1 is a schematic illustration of a side view of a semiconductor substrate having isolated regions having an NMOS and PMOS device, respectively, and a gate dielectric layer overlying the substrate in accordance with an embodiment of the invention.

FIGS. 1–9 illustrate an embodiment of a method of forming PMOS and CMOS devices utilizing the complementary metal gate technology of the invention. FIG. 1 shows a semiconductor substrate 100 having shallow trench isolation structures 110 formed in substrate 100, such as a silicon substrate. In this embodiment, shallow trench isolation structures 110 define regions or areas for individual transistor devices. FIG. 1 also shows the formation of wells 105 and 115 in the individual regions or areas defined by shallow trench isolation structures 110. For example, P-type well 105 is formed in one region of substrate 100 while N-type well 115 is formed in a second region of substrate 100. The P-type well is formed by introducing a dopant, such as boron into the substrate. N-type well 115 is formed by introducing a dopant, such as arsenic, phosphorous, or antimony into substrate 100. The practice of forming shallow trench isolation structures 110 and wells 105 and 115 are known in the art and are not presented herein.

FIG. 1 also shows substrate 100 after the further processing step of forming a gate dielectric over the surface of substrate 100. The gate dielectric may be grown or deposited. An example of a gate dielectric that is typically grown by thermal techniques over substrate 100 is silicon dioxide ($SiO_2$). It is to be appreciated that other gate dielectrics may also be used to further optimize the NMOS and PMOS devices. For example, gate dielectrics having a high dielectric constant design may be utilized in an appropriate manner as known in the art.

Figure 2:
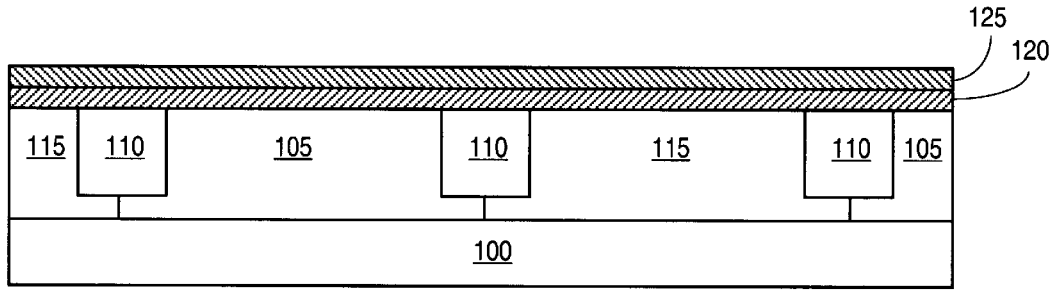
FIG. 2 shows the substrate of FIG. 1 after the further processing step of forming a barrier layer overlying the gate dielectric layer in accordance with an embodiment of the invention.

After gate dielectric 120 is formed, FIG. 2 shows a substrate of FIG. 1 after the further processing step of depositing barrier layer 125 over gate dielectic 120. Barrier layer 125 is of a material that prevents an interaction between gate dielectric 120 and a subsequently deposited metal for a metal gate electrode. Barrier layer 125 also acts as an etch-stop during subsequent processing to protect gate dielectric 120 from being destroyed by an etch patterning of a gate electrode.

In one embodiment, barrier layer 125 has a thicknes on the order of, for example, 5 to 200 Å. The material chosen for barrier layer 125, in one embodiment, has a low density of states (e.g., small amount of free carriers). In this manner, the low density of states of the material allows the barrier layer 125 to be pinned or controlled by an overlying metal gate electrode. In one embodiment, the thickness of barrier layer 125 is less than a critical thickness determined by the density of states of the barrier layer (e.g., a thickness in which the carriers in the barrier layer will effect the work function of the gate electrode stack-barrier layer plus metal layer). The lower the charge density of the density of states, the greater the critical thickness of barrier layer 125. In this manner, the work function of the gate electrode stack (i.e., barrier layer plus metal layer) is determined by the metal layer and not the barrier layer. Examples of suitable barrier layers include, but are not limited to, undoped polysilicon, titanium nitride (TiN), tantalum nitride (TaN), and tantalum silicon nitride (TaSiN).

Figure 3:
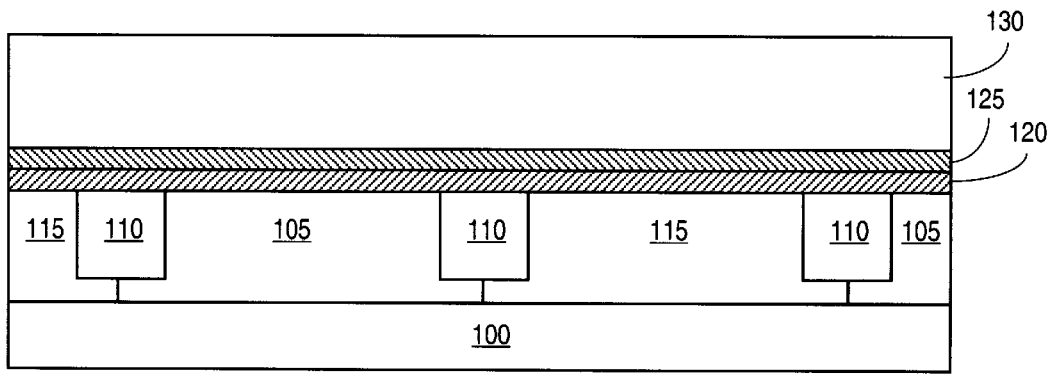
FIG. 3 shows the substrate of FIG. 1 after the further processing step of depositing an N-type metal layer over the barrier layer in accordance with an embodiment of the invention.

FIG. 3 shows substrate 100 after the further processing step of depositing metal layer 130, such as for example, an N-type metal layer or a P-type metal layer. Metal layer 130 is deposited to a desired gate electrode thickness suitable for the integrated circuit device characteristics. By describing metal layer as either N-type or P-type, it is meant that the metal has a work function optimized for either an NMOS or a PMOS device. In other words, the work function of the metal layer is close to that of a corresponding Fermi level N-type doped polysilicon (e.g., 4.15 electron-volts) or P-type doped polysilicon (e.g., 5.2 electron-volts).

The invention describes metals having close to the corresponding Fermi level of either N-type or P-type doped polysilicon. It is to be appreciated that the suitable metal may exist at the desired work function in its natural state or by chemical reaction, alloying, doping, etc. In this embodiment, FIG. 3 is described as depositing an N-type metal layer 130 such as, for example, $TiSi_2$, over substrate 100 and the remainder will proceed on that assumption. It is to be appreciated, however, that the method of the invention is not to be limited to a process restricting the order of the deposition of optimized metal materials.

Figure 4:
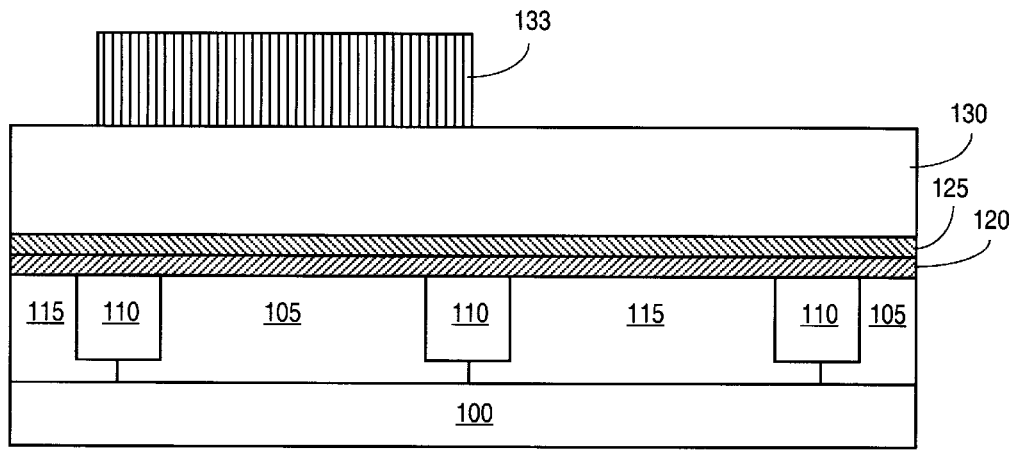
FIG. 4 shows the substrate of FIG. 1 after the further processing step of patterning a photoresist over the N-type metal layer in an area identified for an N-type device in accordance with an embodiment of the invention.

FIG. 4 shows substrate 100 after the further processing step of patterning photoresist layer 133 over a portion of metal layer 130. In FIG. 4, photoresist layer 133 is patterned over a portion of metal layer 130 identified with P-type well 105, implying that the area or cell region above P-type well 105 will incorporate an N-type device. Photoresist layer 133 may be patterned by techniques known in the art such as applying a light-sensitive material over N-type metal layer 130, exposing the material over the area associated with P-type well 105, and removing the unexposed material. It is to be appreciated that photoresist layer 133 serves as a masking layer. The scope of the method of the invention should not be limited by the use of photoresist material as the masking layer, but should contemplate other masking layers, such as, for example, dielectrics and other materials.

Figure 5:
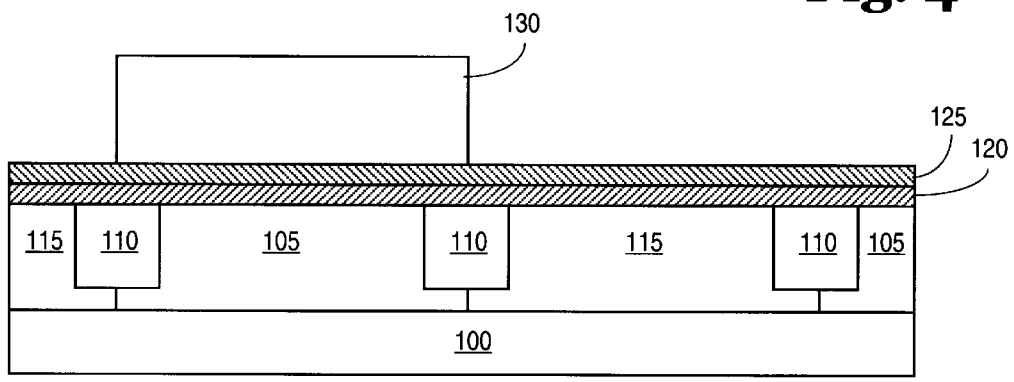
FIG. 5 shows the substrate of FIG. 1 after the further processing step of removing N-type material in all areas of the substrate except those identified for an N-type device and the removal of any photoresist protecting the N-type metal in accordance with an embodiment of the invention.

As shown in FIG. 4, photoresist layer 133 protects the entirety of the device region or cell region occupied by P-type well 105. In this manner, photoresist layer 135 extends from shallow trench isolation structures 110 between the device region. FIG. 5 shows substrate 100 after the further processing step of etching metal layer 130 with a suitable etchant (such as a chlorine-chemistry etchant) and removing photoresist layer 133. Metal layer 130 is removed from all areas except the area above P-type well 105.

As shown in FIG. 5, the etch of metal layer 130 removes metal layer 130 material from all areas of substrate 100 except for those areas protected by photoresist layer 133. The etch of metal layer 130 stops at barrier layer 125. In this manner, gate dielectric layer 120 is not damaged. Barrier layer 125 functions as an etch stop to protect gate dielectric layer 120.

Figure 6:
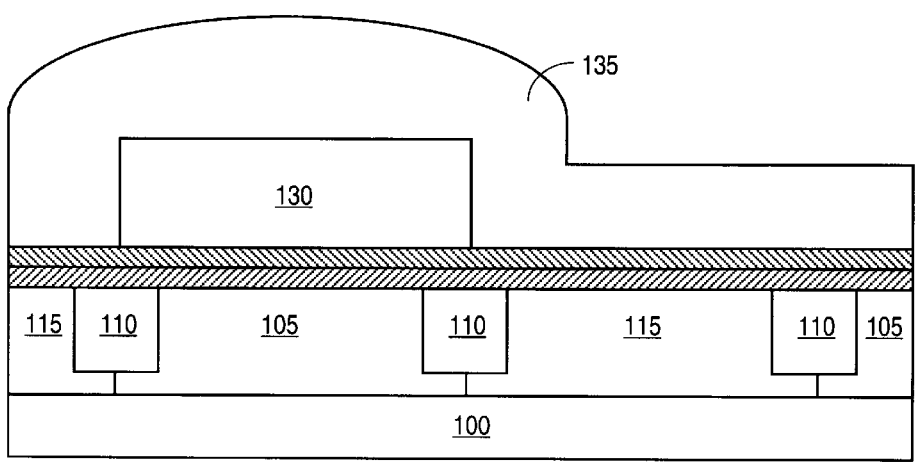
FIG. 6 shows the substrate of FIG. 1 after the further processing of depositing a P-type metal over the substrate in accordance with an embodiment of the invention.

FIG. 6 shows substrate 100 after the further processing step of removing photoresist layer 133 and depositing a complementary metal, in this case P-type metal layer 135 over substrate 100. P-type metal layer 135 is conformally deposited over the surface of substrate 100 in that the thickness of metal layer 135 is consistent throughout and conforms to the topography of the surface of substrate 100. The thickness of P-type metal layer is chosen according to the desired device characteristics. An example of metals suitable as P-type metal layer 135 includes, but is not limited to, $MoSi_2$. These metal materials have work functions close to that corresponding to the Fermi level of P-type doped polysilicon (e.g., 5.2 electron-volts).

Figure 7:
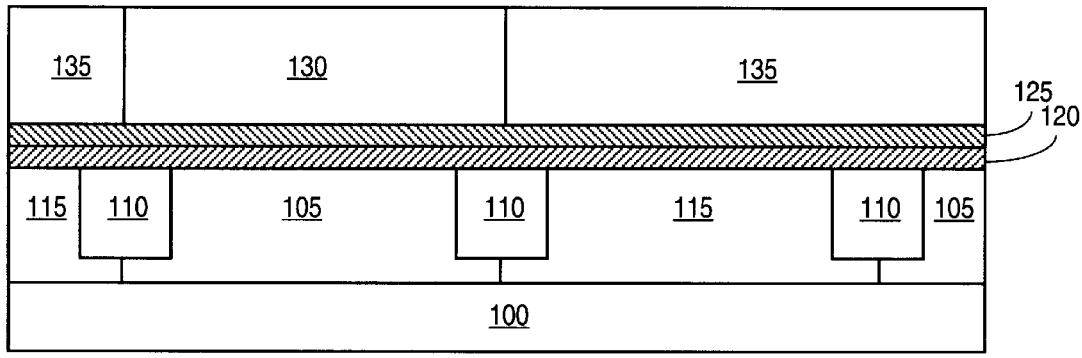
FIG. 7 shows the substrate of FIG. 1 after the further processing step of planarizing the P-type metal to the N-type metal in accordance with an embodiment of the invention.

FIG. 7 shows substrate 100 after the further processing step of planarizing P-type metal layer 135 to N-type metal layer 130. The planarization may be accomplished by the use of a chemical-mechanical polish suitable for polishing metal layer 135. As shown in FIG. 7, P-type metal layer 135 is planarized to N-type metal layer 130. In other words, the planarization of P-type metal layer 135 proceeds until the polishing contacts N-type metal layer 130 and the polishing is stopped. Thus, the N-type metal layer 130 acts as a polishing stop.

Figure 8:
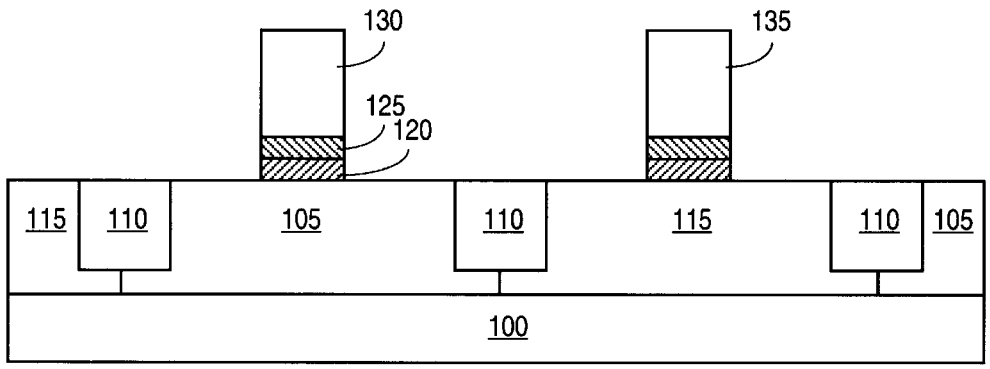
FIG. 8 shows the substrate of FIG. 1 after the further processing step of forming N-type and P-type gate devices in their respective areas in accordance with an embodiment of the invention.

FIG. 8 shows substrate 100 after the further processing step of etching (such as, for example, with a chorine-chemistry etchant) the individual metal layers 130 and 135 over their respective device regions. As shown in FIG. 8, N-type metal layer 130 is formed into metal gate electrode 130 over the region of substrate 100 occupied by P-type well 105. P-type metal layer 135 is patterned into P-type gate electrode 135 over an area of substrate 100 occupied by N-type well 115. The lateral width of the individual N-type gate electrode 130 and P-type gate electrode 135 are selected in accordance with the desired characteristics of the NMOS and PMOS device. Patterned in accordance with electrodes 130 and 135 are barrier layer 125 and gate dielectric 120. A suitable etchant to pattern a barrier layer of undoped polysilicon is, for example, a $CF_4$ chemistry. This same etchant may be used to pattern the relatively thin gate dielectric layer 120.

Figure 9:
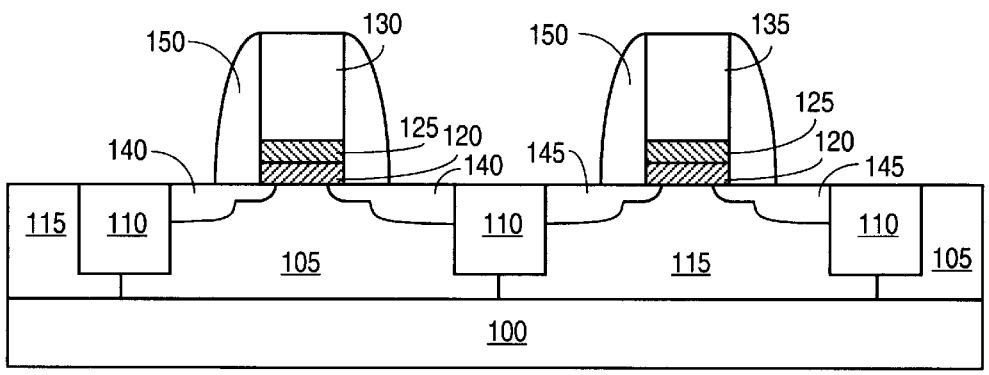
FIG. 9 shows the substrate of FIG. 1 after the further processing step of forming complementary diffusion or junction regions in the substrate adjacent the N-type gate electrode and the P-type gate electrode, respectively, in accordance with an embodiment of the invention.

FIG. 9 shows substrate 100 after the further processing step of forming diffusion or junction regions in substrate 100 in accordance with the characteristics of the desired device. In one embodiment, the diffusion or junction regions will have work functions similar to the metal gate electrode 130 and 135, respectively. With respect to the N-type device identified by the N-type gate electrode 130 overlying P-type well 105, N-type diffusion or junction regions 140 are formed in P-well 105 in accordance with conventional techniques. For example, N-type or junction regions may be formed adjacent the gate electrode and self-aligned to the gate by implanting a suitable dopant, such as, for example, arsenic, phosphorous, or antimony, into P-well 105. Similar processing steps may be used to form P-type diffusion or junction regions 145, using a dopant, such as, for example, boron. Pocket dopants may also be added at this point if desired. Once diffusion or junction regions are formed, gate isolation spacers 150 of a suitable dielectric may be incorporated around gate electrode 130 and gate electrode 135 to insulate the individual electrodes of the complementary transistor devices. The individual devices may then be connected in a conventional manner, if desired, to form a CMOS device (e.g., a CMOS inverter).

The above process described a method of forming complementary metal gate electrodes without damaging the gate dielectric. The invention does this by deploying a barrier layer between the gate dielectric and the metal gate. In this manner, the invention is particularly useful for constructing high performance NMOS and PMOS devices for use in CMOS technologies with current and future scaled technologies. In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed:

1. An integrated circuit device comprising:

a first transistor including a first metal gate electrode overlying a first barrier layer over a first gate dielectric on a first area of a semiconductor substrate; and a second transistor coupled to the first transistor including a second metal gate electrode overlying a second barrier layer over a second gate dielectric on a second area of a semiconductor substrate, wherein the first area and the second area are of different conductivity types and the first metal gate electrode and the second metal rate electrode have different work functions.

2. The integrated circuit device of claim 1, wherein the work function of the first gate electrode approximates a work function of N-type doped polysilicon and the work function of the second gate electrode approximates a work function of P-type doped polysilicon.

3. The integrated circuit device of claim 1, wherein the barrier layer is one of undoped polysilicon, titanium nitride, tantalum nitride, and tantalum silicon nitride.

4. A complementary metal oxide semiconductor (CMOS) device comprising:

a first transistor including a first metal gate electrode overlying a first barrier layer over a first gate dielectric on a first area of a semiconductor substrate; and a second transistor coupled to the first transistor including a second metal gate electrode overlying a second barrier layer over a second gate dielectric on a second area of a semiconductor substrate, wherein the first area and the second area are of different conductivity types and the first metal gate electrode and the second metal gate electrode have different work functions.

5. The CMOS device of claim 4, wherein the work function of the first gate electrode approximates a work function of N-type doped polysilicon and the work function of the second gate electrode approximates a work function of P-type doped polysilicon.

6. The CMOS device of claim 4, wherein the barrier layer is one of undoped polysilicon, titanium nitride, tantalum nitride, and tantalum silicon nitride.

* * * * *